United States Patent
Zhai et al.

(10) Patent No.: US 10,825,483 B2
(45) Date of Patent: Nov. 3, 2020

(54) HEAT SINKING ENCLOSURE FOR DISK ARRAY

(71) Applicant: DELL PRODUCTS, L.P., Round Rock, TX (US)

(72) Inventors: Haifang Zhai, Shanghai (CN); Hendry Wu, Shanghai (CN); David Dong, Shanghai (CN); Yujie Zhou, Shanghai (CN)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/243,903

(22) Filed: Jan. 9, 2019

(65) Prior Publication Data

US 2019/0333545 A1 Oct. 31, 2019

(30) Foreign Application Priority Data

Apr. 28, 2018 (CN) .......................... 2018 1 0399931

(51) Int. Cl.
*G11B 33/14* (2006.01)
*H05K 7/20* (2006.01)

(52) U.S. Cl.
CPC ........ *G11B 33/142* (2013.01); *H05K 7/20136* (2013.01); *H05K 7/20436* (2013.01); *H05K 7/20736* (2013.01)

(58) Field of Classification Search
CPC .... H05K 7/20136–2019; H05K 7/2039–2049; H05K 7/20554–20581; H05K 7/20718–20736; G06F 1/20; G06F 1/187; G11B 33/1406–144; G11B 33/00–1493
See application file for complete search history.

(56) References Cited

U.S. PATENT DOCUMENTS

| | | | | |
|---|---|---|---|---|
| 6,141,211 A | * | 10/2000 | Strickler | G06F 1/184 361/679.31 |
| 6,317,334 B1 | * | 11/2001 | Abruzzini | G11B 33/126 361/679.33 |
| 7,444,396 B2 | * | 10/2008 | King | H04L 63/0428 709/223 |
| 8,755,191 B2 | * | 6/2014 | Riebel | H05K 7/1488 361/679.38 |
| 9,535,471 B2 | * | 1/2017 | Davis | G06F 1/206 |
| 2009/0229283 A1 | * | 9/2009 | Marsala | G11B 33/1413 62/119 |
| 2019/0029145 A1 | * | 1/2019 | Zardkoohi | H05K 7/20727 |

* cited by examiner

*Primary Examiner* — Zachary Pape
(74) *Attorney, Agent, or Firm* — Isidore PLLC

(57) ABSTRACT

Embodiments of the present disclosure relate to an enclosure for a disk array. The enclosure comprises a chassis for receiving the disk array. Each disk in the disk array is enclosed by a frame. The enclosure also comprises a heat sink including a plurality of metal bars arranged on a bottom face of the chassis. Each of the plurality of metal bars is adapted to contact a respective disk through a notch in the frame of the respective disk, to position the respective disk and to transfer heat generated by the respective disk to the chassis. In the embodiments of the present disclosure, the metal bars may be used not only for reliable positioning of the disks, but also for improving thermal dissipation performance.

13 Claims, 5 Drawing Sheets

HEAT SINKING ENCLOSURE FOR DISK ARRAY

PRIORITY

The present application claims priority from Chinese Application No. 201810399931.1 filed on Apr. 28, 2018, the entire contents of which is incorporated herein by reference.

FIELD

Embodiments of the present disclosure generally relate to a storage device, and more specifically, to an enclosure for a disk array, a disk adapted to be used with the enclosure, a storage device including the enclosure, and a method of manufacturing the enclosure.

BACKGROUND

During the design of an enclosure of a multi-row disk array, thermal performance is the biggest challenge. As the storage technology develops, the power consumption of the storage device increases in response to the requirement for more rapid reading speed and the like. This increase in power consumption requires a more effective thermal dissipation solution. The traditional solutions mainly focus on enhancing fan capacity. However, the increase of fan capacity is limited by factors, such as space, volume, and the like. Furthermore, a fan brings side effects such as noise, etc. Therefore, enhancing fan capacity is not an ideal solution.

SUMMARY

Embodiments of the present disclosure provide an enclosure for a disk array, a disk adapted to be used with the enclosure, a storage device including the enclosure, and a method of manufacturing the enclosure.

In a first aspect of the present disclosure, there is provided an enclosure for a disk array. The enclosure comprises a chassis for receiving the disk array. Each disk in the disk array is enclosed by a frame. The enclosure also comprises a heat sink comprising a plurality of metal bars arranged on a bottom face of the chassis. Each of the plurality of metal bars is adapted to contact a respective disk through a notch in the frame of the respective disk, in order to position the respective disk and to transfer heat generated by the respective disk to the chassis.

In some embodiments, the heat sink further comprises a metal bottom part that couples at least two metal bars of the plurality of metal bars and couples the at least two metal bars to the bottom face of the chassis.

In some embodiments, the heat sink further comprises a metal side part arranged on a side wall of the chassis and coupled to the metal bottom part.

In some embodiments, the plurality of metal bars are arranged in rows in parallel, along a direction perpendicular to a longitudinal direction of the metal bars.

In some embodiments, a side face of each metal bar comprises an opening.

In some embodiments, the opening penetrates through each metal bar.

In some embodiments, each metal bar comprises an annulation formed by bending a metal ribbon.

In some embodiments, an end of each metal bar forms an arc.

In some embodiments, the notch of the frame forms a trapezoid, and an upper base of the trapezoid is close to each disk.

In some embodiments, the heat sink is made of copper.

In a second aspect of the present disclosure, there is provided a disk adapted to be used with the enclosure according to the first aspect of the present disclosure. The disk is enclosed by the frame having the notch, wherein each metal bar is adapted to contact the disk through the notch.

In a third aspect of the present disclosure, there is provided a storage device comprising the enclosure according to the first aspect of the present disclosure and the disk array.

In a fourth aspect of the present disclosure, there is provided a method of manufacturing the enclosure according to the first aspect of the present disclosure.

This Summary is provided to introduce a selection of concepts in a simplified form that are further described below in the Detailed Description. This Summary is not intended to identify key features or essential features of the present disclosure, nor is it intended to be used to limit the scope of the present disclosure.

BRIEF DESCRIPTION OF THE DRAWINGS

The above and other objectives, features and advantages of the present disclosure will become more apparent from more detailed description of some embodiments of the present disclosure with reference to the accompanying drawings, in which the same reference symbols are used to indicate the same elements.

DETAILED DESCRIPTION OF EMBODIMENTS

Figure 1:
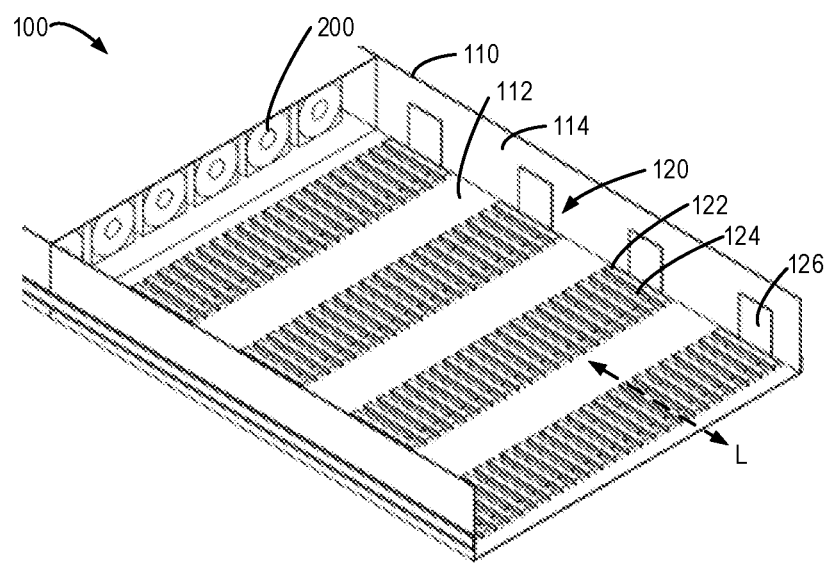
FIG. 1 illustrates a schematic diagram of an enclosure for a disk array, according to one embodiment of the present disclosure.

Embodiments of the present disclosure will be described in the following in greater detail with reference to the drawings. Although embodiments of the present disclosure are shown in the drawings, it is to be understood that the present disclosure can be implemented in various manners, not limited to the embodiments illustrated herein. On the contrary, these embodiments are provided to make the present disclosure more thorough and complete and convey the scope of the present disclosure completely to those skilled in the art.

The term "comprise" and its variations used in the present disclosure mean comprising in an open-ended sense, i.e.

"include without limitation". Unless otherwise specified, the term "or" means "and/or". The term "based on" means "at least partially based on". The terms "one exemplary embodiment" and "one embodiment" represent "at least one embodiment"; the term "another embodiment" represents "at least one other embodiment". The terms "first", "second" and the like may refer to different or the same objects. Other explicit and implicit definitions might further be included in the following description.

During the design of an enclosure of a disk array, thermal performance is the biggest challenge. A single disk in a current disk array in the market has a power of about 10 W. As the storage technology develops, the power of a Non-Volatile Memory express (NVMe) has increased to about 25 W. A more effective thermal dissipation solution must be found for the next-generation storage device with high power consumption. The traditional solutions mainly focus on enhancing fan capacity. However, the increase of fan capacity is limited by factors, such as space volume and the like. Furthermore, a fan brings side effects such as noise, etc. Therefore, enhancing fan capacity is not an ideal solution.

Embodiments of the present disclosure provide an enclosure for a disk array to at least partially solve the above and other potential problems of the traditional solutions.

Figure 2:
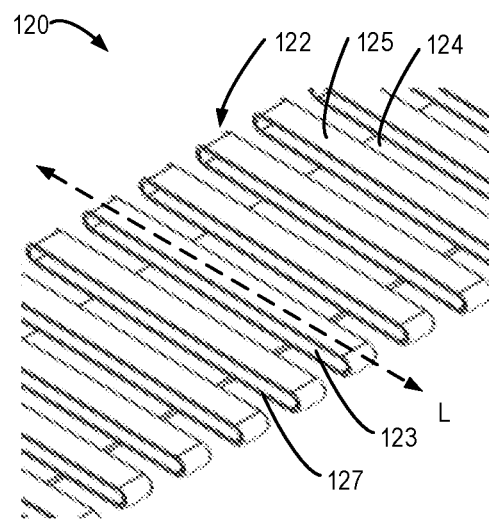
FIG. 2 illustrates a local schematic diagram of a heat sink, according to one embodiment of the present disclosure.
Figure 3:
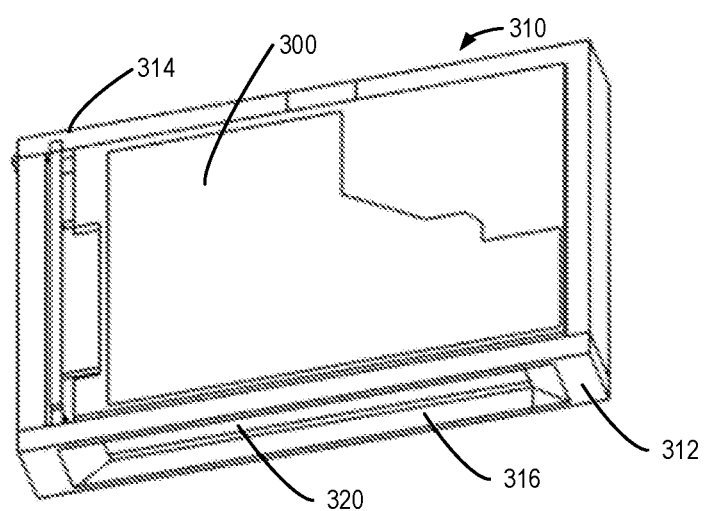
FIG. 3 illustrates a schematic diagram of a disk, according to one embodiment of the present disclosure.

The structure of an enclosure according to exemplary embodiments of the present disclosure will be explained below with reference to FIGS. 1 to 8. FIG. 1 illustrates a schematic diagram of an enclosure 100 for a disk array according to one embodiment of the present disclosure; FIG. 2 illustrates a local schematic diagram of a heat sink 120 according to one embodiment of the present disclosure; FIG. 3 illustrates a schematic diagram of a disk 300 according to one embodiment of the present disclosure; and FIG. 4 illustrates a schematic diagram of a disk 300 and a heat sink 120 separated from each other according to one embodiment of the present disclosure.

As shown in FIG. 1, an enclosure 100 for receiving a disk array generally may include a chassis 110 and a heat sink 120 provided on an inner surface of the chassis 110. The heat sink 120 includes a plurality of metal bars 122. Each metal bar 122 is arranged on a bottom face 112 of the chassis 110. Each metal bar 122 corresponds to a respective disk 300 to be mounted. As shown in FIG. 3, the disk 300 that forms the disk array is enclosed by a frame 310. The frame 310 may only enclose the periphery of the disk 300, and two larger side faces of the disk 300 are exposed to facilitate thermal dissipation. The frame 310 may be made of plastic or metal. The frame 310 includes a notch 316, and the notch 316, for example, is provided in a bottom part 312 of the frame 310.

Figure 4:
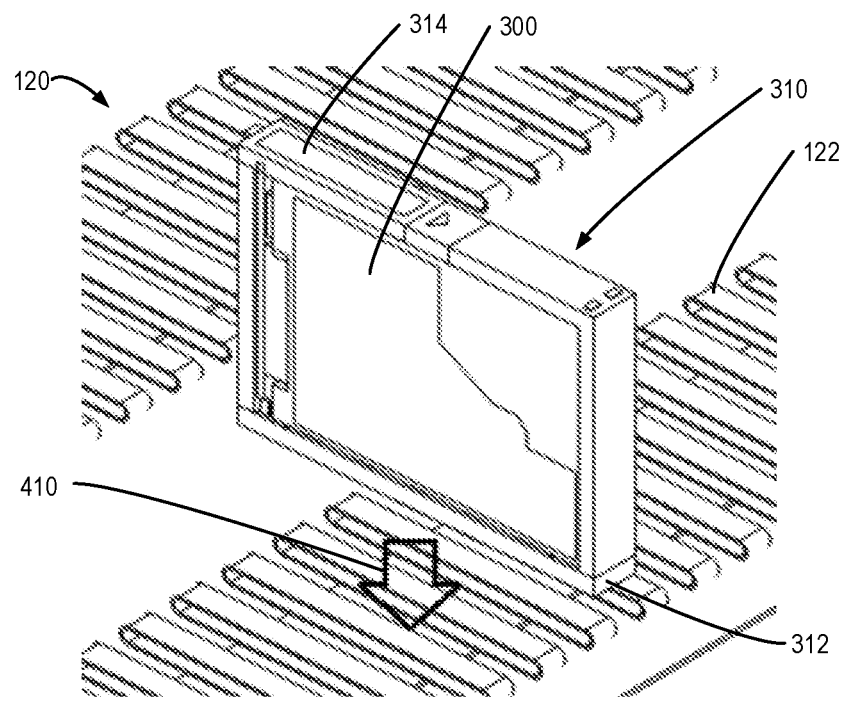
FIG. 4 illustrates a schematic diagram of a disk and a heat sink separated from each other, according to one embodiment of the present disclosure.

An arrow 410 in FIG. 4 indicates an assembly direction between the disk 300 and the heat sink 120. When the disk 300 is pushed down towards the metal bar 122, the metal bar 122 will contact the disk 300 through the notch 316 of the frame 310. When the disk 300 and the metal bar 122 are assembled together, a bottom face 320 of the disk 300 contacts a top face 125 of the metal bar 122. A bottom face 127 of the metal bar 122 may contact the bottom face 112 of the chassis 110. In this way, the metal bar 122 may transfer heat generated by the disk 300 to the chassis 110 to improve thermal dissipation. The top face 125 and the bottom face 127 of the metal bar 122 may be planar to increase contact area. The elongated shape of the metal bar 122 also ensures contact area between the disk 300 and the metal bar 122 and contact area between the metal bar 122 and the chassis 110, so as to enhance thermal performance. The metal bar 122 also may be referred to as a fin. In addition, by the mating between the metal bar 122 and the notch 316 of the frame 310, the metal bar 122 may facilitate reliable positioning of the disk 300 without requiring additional measures for fixing the disk 300.

In some embodiments, the chassis 110 may be made of metal. For example, the chassis 110 may include an iron sheet. By arranging the heat sink 120 on the chassis 110, an existing chassis 110 may be utilized to improve thermal performance without making a big change to the chassis 110. The body of the chassis 110 may be used to cool the disk 300 by transferring heat via the heat sink 120 to the chassis 110. In this way, thermal performance of a multi-row disk array is improved. The metal bar 122 of the heat sink 120 also may have the positioning function without requiring additional positioning features. Thus, the construction is simplified, the cost is saved, and an easy implementation is achieved.

In some embodiments, the plurality of metal bars 122 may be arranged parallel with each other as shown in FIGS. 1 and 2. The plurality of metal bars 122 are arranged in rows in parallel along a direction perpendicular to a longitudinal direction L of the metal bar 122. A plurality of rows of metal bars 122 may be arranged on the bottom face 112 of the chassis 110. One row of metal bars 122 may be adapted to mount one row of disks 300 in a multi-row disk array, which may facilitate mounting the disk array to save space in the storage device.

In some embodiments, as shown in FIGS. 1 and 2, a metal bottom part 124 is arranged beneath the metal bars 122. The metal bottom part 124 couples at least two metal bars 122 of the plurality of metal bars 122, and couples the at least two metal bars 122 to the bottom face 112 of the chassis 110. The metal bottom part 124 may increase the contact area between the at least two metal bars 122 and the bottom face 112 to distribute heat over a larger area of the chassis 110. In one example, a metal bottom part 124 couples a row of metal bars 122 together. The metal bottom part 124 may extend along a direction perpendicular to the longitudinal direction L of a metal bar 122. The dimension of the metal bottom part 124 may be designed to obtain expected thermal dissipation efficiency.

In some embodiments, apart from the metal bottom part 124, the heat sink 120 also includes a metal side part 126 arranged on a side wall 114 of the chassis 110. The metal side part 126 is coupled to the metal bottom part 124. Therefore, the metal bottom part 124 also may transfer heat generated by the disk 300 to the side wall 144 of the chassis 110 to dissipate the heat through the side wall 114, which further increases thermal dissipation area and thermal dissipation efficiency. In this way, the whole chassis 110 may be used for cooling the disk 300 to satisfy, for example, the current severe cooling requirement of a NVMe 25 W drive.

In some embodiments, the heat sink 120 may be made of copper. In other words, the metal bar 122, metal bottom part 124 and metal side part 126 are all made of copper. The thermal performance of the storage device may be improved with high thermal conductivity of the copper. Moreover, it may facilitate manufacturing the heat sink 120 by the metal bar 122, metal bottom part 124 and metal side part 126 being made of the same material. For example, the metal bar 122, metal bottom part 124 and metal side part 126 of the same material may make it convenient to solder them together. Alternatively, the metal bar 122, metal bottom part 124 and metal side part 126 may be coupled together with a screw. The entirety or a part of the heat sink 120 also may be coupled to the chassis 110 by means of soldering or screwing. Alternatively, the metal bar 122, metal bottom part 124 and metal side part 126 also may be made of different metal materials.

In some embodiments, the notch 316 of the frame 310 may form a trapezoid as shown in FIG. 3 and an upper base of the trapezoid is close to the disk 300. Such a notch 316 that is wide outside and narrow inside avoids troublesome alignment between the notch 316 and the metal bar 122, so as to facilitate positioning the disk 300 on the metal bar 122. In this way, alignment and installation of the disk 300 become simpler and easier.

Figure 5:
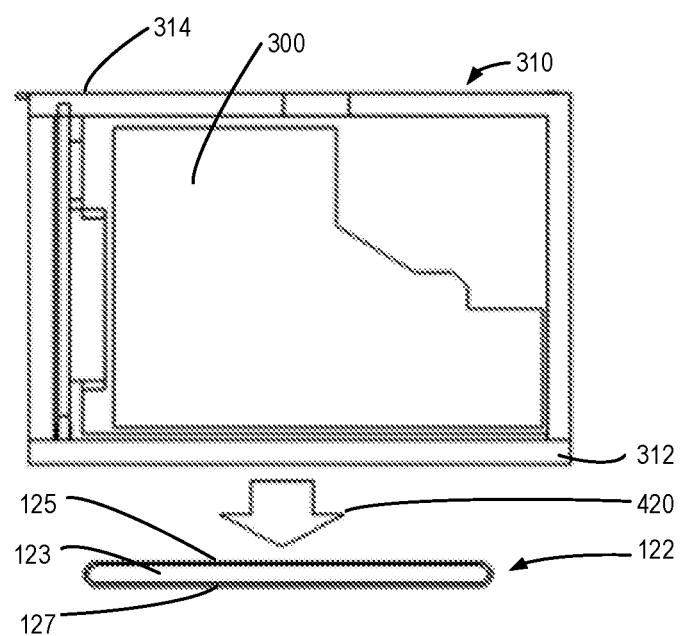
FIG. 5 illustrates a schematic side view of a disk and a metal bar separated from each other, according to one embodiment of the present disclosure.

FIG. 5 illustrates a schematic side view of a disk 300 and a metal bar 122 separated from each other according to one embodiment of the present disclosure, wherein the arrow 420 indicates an assembly direction between the disk 300 and the metal bar 122. As shown in FIGS. 2 and 5, in some embodiments, a side face of the metal bar 122 includes an opening 123, which may increase the surface area of the metal bar 122 exposed to air to further enhance thermal dissipation efficiency. The side face here refers to a side face of the metal bar 122 different from the top face 125 and the bottom face 127. As described above, when the disk 300 and the metal bar 122 are assembled together, the top face 125 of the metal bar 122 will contact the bottom face 320 of the disk 300. The bottom face 127 of the metal bar 122 may contact the metal bottom part 124 or directly contact the bottom face 112 of the chassis 110.

In some embodiments, the opening 123 penetrates through the metal bar 122, which further increases the surface area of the metal bar 122 to improve thermal dissipation. For example, the metal bar 122 may be an annulation formed by bending a metal ribbon. Therefore, the metal bar 122 may be manufactured in a simple way to reduce cost. An end of the metal bar 122 may form an arc to facilitate machining. Furthermore, the arc end of the metal bar 122 may be manufactured, for example, thin enough to have elasticity to a certain extent. When a force is applied perpendicularly downward onto the disk 300 during assembly, the metal bar 122 may be lodged in the notch 316 of the frame 310 and tightly contact a wall of the notch 316.

Figure 6:
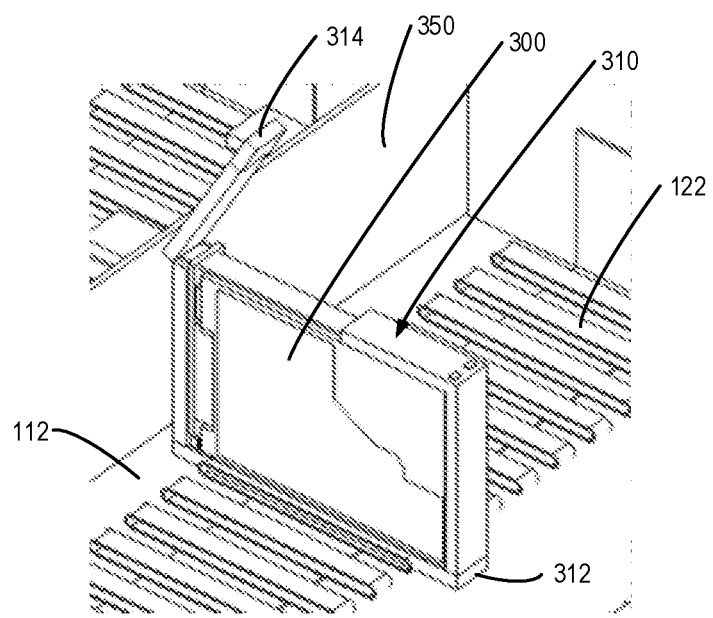
FIG. 6 illustrates a schematic diagram of a disk and a metal bar assembled together, according to one embodiment of the present disclosure.

FIG. 6 illustrates a schematic diagram of a disk 300 and a metal bar 122 assembled together according to one embodiment of the present disclosure. FIG. 6 illustrates a circuit board 350 arranged for a row of disks 300. The circuit board 350 is standing relative to the bottom face 112 of the chassis 110 and provides an electrical connection for the disk 300. FIG. 6 also illustrates a locking component 314, which may be a part of the frame 310 of the disk 300. In some embodiments, the locking component 314 may have a feature for fixing the disk 300 to the chassis 110. For example, the locking component 314 may mate with a corresponding feature on the chassis 110. The locking component 314 may ensure that the disk 300 always contacts the underlying metal bar 122. Moreover, when the disk 300 needs to be pulled out, the locking component 314 may spring to act as a handle (as shown in FIG. 6). In some cases (e.g., when the disk 300 is inserted on the metal bar 122), the locking component 314 may be closed (as shown in FIGS. 3 to 5).

Figure 7:
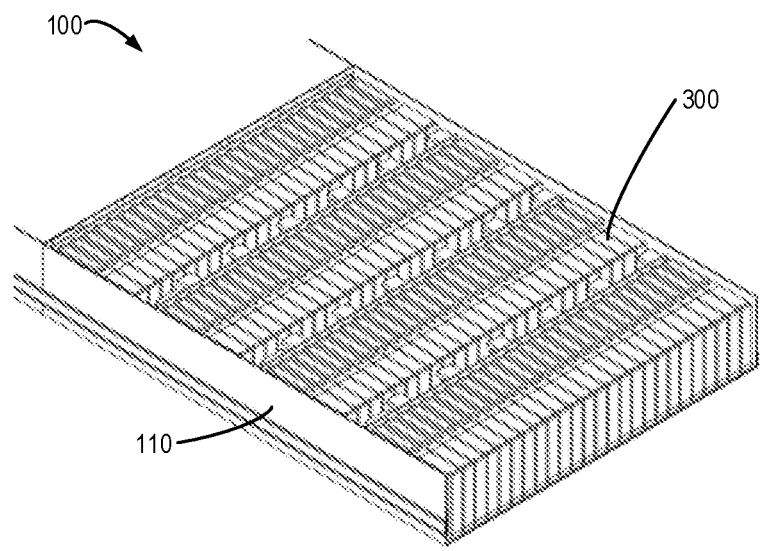
FIG. 7 illustrates a schematic diagram of an enclosure containing a disk array, according to one embodiment of the present disclosure.

FIG. 7 illustrates a schematic diagram of an enclosure 100 containing a disk array inside according to one embodiment of the present disclosure. The disk array is formed by disks 300. The disk array contained inside the enclosure 100 may act as a storage device. The enclosure 100 also may include a top cover (not shown). The top cover and the chassis 110 together form the enclosure 100. When a disk 300 needs to be inserted and/or extracted, the top cover may be opened or removed.

Figure 8:
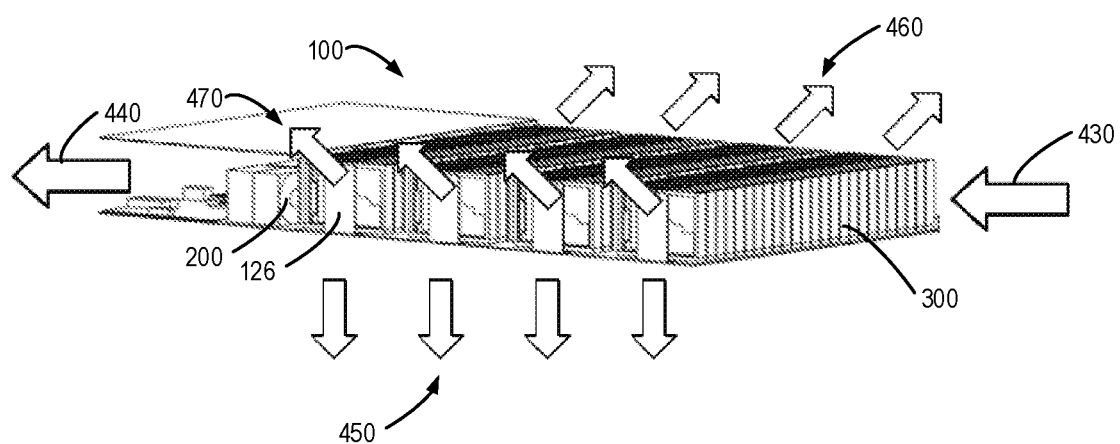
FIG. 8 illustrates thermal dissipation performance of a heat sink, according to one embodiment of the present disclosure.

FIG. 8 illustrates thermal dissipation performance of a heat sink 120 according to one embodiment of the present disclosure. As shown in FIGS. 1 and 8, one or more fans 200 may be disposed at an end of the enclosure 100. The enclosure 100 has an opening but no side wall at an end opposite to the fans 200. The fans 200 may suck air through the opening to form an airflow indicated by arrows 430 and 440. This airflow provides a traditional way for dissipating heat of the disks 300, wherein the arrow 430 denotes cold air entering the storage device while the arrow 440 denotes hot air exiting the storage device. In the embodiments of the present disclosure, apart from the above traditional thermal dissipating way, additional thermal dissipation paths also are provided due to arrangement of the metal bar 122, metal bottom part 124 and/or metal side part 126. The additional thermal dissipation paths include a thermal dissipation path via a bottom part of the chassis 110 indicated by arrow 450, and/or a thermal dissipation path via a side wall 144 of the chassis 110 indicated by arrows 460 and 470. Thus, a cooling method via the body of the chassis 110 is provided, which improves thermal dissipation of the disks 300. Simulation result demonstrates that the chassis cooling according to embodiments of the present disclosure may decrease the temperature of the disks 300 by 3 to 5 degree centigrade. At the same time, the temperature of the chassis 110 will not increase significantly. It is noted that the numerical value is provided only by way of example and is not intended to restrict the scope of the present disclosure in any manners.

Some examples of the enclosure 100 have been described above. Such an enclosure 110 may be manufactured by any suitable methods. For example, the parts of the heat sink 120 may first be assembled into the heat sink 120 and then the heat sink 120 as a whole is coupled to the chassis 110. Alternatively, the parts of the heat sink 120, which are not assembled together in advance, may be respectively coupled to the chassis 110.

By way of example rather than for limitation, the disk 300 in the present disclosure may include a hard disk, a hard disk drive or a solid-state disk.

Although some specific embodiments of the present disclosure have already been displayed in detail by way of examples, those skilled in the art should appreciate that the above examples are only intended to exemplarily but non-restrictively limit the scope of the present disclosure. Those skilled in the art appreciate that the above embodiments may be modified without departing from the scope and essence of the present disclosure. The scope of the present disclosure is limited by the appended claims.

In the description and claims hereunder, unless otherwise additionally needed in the context, the terms "comprise" and "comprise" are understood as comprising the illustrated components or component groups, without excluding any other components or component groups.

Citations of any prior art in the description are not, and should not be considered as admitting to imply that these prior art constitute the common knowledge.

It is to be understood that the claims below are only examples of possible claims, and are not intended to limit the scope of the claims to any future patent application based on the present application. It is possible to add components to or delete components from the exemplary claims in the future to further limit or re-limit the present disclosure.

We claim:
1. An enclosure (100) for a disk array, the enclosure comprising:
   a chassis (110) for receiving the disk array, wherein each disk (300) in the disk array is enclosed by a frame (310);

a heat sink (120) comprising a plurality of metal bars (122) arranged on a bottom face (112) of the chassis (110), each of the plurality of metal bars (122) being adapted to contact a respective disk (300) through a notch (316) in the frame (310) of the respective disk (300), the notch configured to position the respective disk (300) on a metal bar among the plurality of metal bars of the heat sink without requiring additional measures for fixing the respective disk into position, and the metal bar to hold the respective disk in position and to transfer heat generated by the respective disk (300) to the chassis (110); and a metal bottom part (124) coupling at least two metal bars (122) of the plurality of metal bars (122) and coupling the at least two metal bars (122) to the bottom face (112) of the chassis (110).

2. The enclosure (100) of claim 1, wherein the heat sink (120) further comprises:

a metal side part (126) arranged on a side wall (114) of the chassis (110) and coupled to the metal bottom part (124).

3. The enclosure (100) of claim 1, wherein the plurality of metal bars (122) are arranged in rows in parallel along a direction perpendicular to a longitudinal direction (L) of the metal bars (122).

4. The enclosure (100) of claim 1, wherein a side face of each metal bar (122) comprises an opening (123).

5. The enclosure (100) of claim 4, wherein the opening (123) penetrates through each metal bar (122).

6. The enclosure (100) of claim 1, wherein each metal bar (122) comprises an annulation formed by bending a metal ribbon.

7. The enclosure (100) of claim 1, wherein an end of each metal bar (122) forms an arc.

8. The enclosure (100) of claim 1, wherein the notch (316) of the frame (310) forms a trapezoid to provide easier alignment and installation of the respective disk on the metal bar and an upper base of the trapezoid is close to each disk (300).

9. The enclosure (100) of claim 1, wherein the heat sink (120) is made of copper.

10. A disk (300) adapted to be used with the enclosure (100) according to claim 1, the disk (300) being enclosed by the frame (310) having the notch (316), wherein each metal bar (122) is adapted to contact the disk (300) through the notch (316).

11. A storage device, comprising:

the enclosure (100) according to claim 1; and the disk array.

12. A method of manufacturing the enclosure (100) according to claim 1.

13. The enclosure of claim 1, further comprising a locking component having a feature for fixing the respective disk to the chassis and ensuring the disk is in contact with an underlying one of the plurality of metal bars.

* * * * *